United States Patent
Schmidts et al.

(10) Patent No.: US 9,482,959 B2
(45) Date of Patent: Nov. 1, 2016

(54) EUV MICROLITHOGRAPHY ILLUMINATION OPTICAL SYSTEM AND EUV ATTENUATOR FOR SAME

(75) Inventors: Nicolas Schmidts, Ingolstadt (DE); Joachim Hartjes, Aalen (DE); Ulrich Bingel, Michelfeld (DE); Boaz Pnini-Mittler, Heuchlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1042 days.

(21) Appl. No.: 13/223,458

(22) Filed: Sep. 1, 2011

(65) Prior Publication Data

US 2012/0069313 A1    Mar. 22, 2012

Related U.S. Application Data

(63) Continuation of application No. PCT/EP2009/002247, filed on Mar. 27, 2009.

(51) Int. Cl.
  *G03B 27/52*    (2006.01)
  *G03B 27/42*    (2006.01)
  *G03F 7/20*    (2006.01)

(52) U.S. Cl.
  CPC ............... *G03F 7/702* (2013.01); *G03F 7/701* (2013.01); *G03F 7/70083* (2013.01); *G03F 7/70191* (2013.01)

(58) Field of Classification Search
  CPC ............... G03F 7/70191; G03F 7/702; G03F 7/70133; G03F 7/70308; G03F 7/20; G03F 7/70158; G03F 7/70233; G03F 7/70058; G03F 7/70075; G03F 7/70091; G03F 7/70391; G03F 7/70558; G03F 7/70125; G03F 7/70141; G03F 7/70225; G03F 7/7055; G21K 1/06
  USPC ......................................... 355/53, 63, 67, 77
  See application file for complete search history.

(56) References Cited

U.S. PATENT DOCUMENTS

| 6,445,510 B1 | 9/2002 | Schuster et al. |
| 7,015,489 B2 | 3/2006 | Singer et al. |

(Continued)

FOREIGN PATENT DOCUMENTS

| CN | 1641482 A | 7/2005 |
| CN | 1272871 C | 8/2006 |

(Continued)

OTHER PUBLICATIONS

Japanese Office Action, with translation thereof, for corresponding JP Appl No. 2012-501137, dated Jun. 19, 2013.

(Continued)

*Primary Examiner* — Mesfin T Asfaw
(74) *Attorney, Agent, or Firm* — Fish & Richardson P.C.

(57) ABSTRACT

An illumination optical system for EUV microlithography is used to direct an illumination light beam from a radiation source to an object field. At least one EUV mirror has a reflective face with a nonplanar mirror topography for forming the illumination light beam. The EUV mirror has at least one EUV attenuator arranged in front of it. The attenuator face which faces the reflective face of the EUV mirror has an attenuator topography which is designed to complement the mirror topography such that at least sections of the attenuator face are arranged at a constant interval from the reflective face. The result is an illumination optical system in which it is possible to correct unwanted variations in illumination parameters, for example an illumination intensity distribution or an illumination angle distribution, over the object field with as few unwanted radiation losses as possible.

24 Claims, 10 Drawing Sheets

(56) References Cited

U.S. PATENT DOCUMENTS

| | | | |
|---|---|---|---|
| 2003/0227603 A1* | 12/2003 | Dierichs | G03F 7/70091 355/47 |
| 2004/0119563 A1 | 6/2004 | Kitaichi et al. | |
| 2005/0134818 A1 | 6/2005 | Van Dijsseldonk et al. | |
| 2005/0270513 A1 | 12/2005 | Dierichs et al. | |
| 2007/0041004 A1 | 2/2007 | Suzuki | |
| 2007/0058274 A1 | 3/2007 | Singer et al. | |
| 2007/0273859 A1 | 11/2007 | Komatsuda | |
| 2008/0165925 A1 | 7/2008 | Singer et al. | |
| 2008/0212059 A1 | 9/2008 | Warm et al. | |
| 2009/0021715 A1* | 1/2009 | Deguenther et al. | 355/67 |

FOREIGN PATENT DOCUMENTS

| | | |
|---|---|---|
| DE | 10 2007 061 194 A1 | 6/2008 |
| EP | 1 225 481 | 7/2002 |
| JP | 2006-128321 | 5/2006 |
| JP | 2007-500432 | 1/2007 |
| JP | 2009-043906 | 2/2009 |
| WO | WO 2004/068564 | 8/2004 |
| WO | WO 2004/100236 | 11/2004 |
| WO | WO 2006/136353 | 12/2006 |
| WO | WO 2007/138805 | 12/2007 |

OTHER PUBLICATIONS

International Search Report for the corresponding PCT Application No. PCT/EP2009/002247, mailed Jan. 25, 2010.

Japanese office action with English translation with respect to parallel Japanese patent application No. 2012-501 137, dated Feb. 26, 2014.

Chinese office action, with English translation, for corresponding CN Appl No. 2009 8015 8506.2, dated Jan. 21, 2014.

Chinese office action, with English translation thereof, for corresponding CN Appl No. 200980158506.2, dated Jun. 5, 2013.

\* cited by examiner

EUV MICROLITHOGRAPHY ILLUMINATION OPTICAL SYSTEM AND EUV ATTENUATOR FOR SAME

CROSS-REFERENCE TO RELATED APPLICATIONS

This application is a continuation of, and claims priority under 35 USC 120 to, international application PCT/EP2009/002247, filed Mar. 27, 2009, which is hereby incorporated by reference in its entirety.

FIELD

The disclosure relates to an illumination optical system for EUV microlithography for directing an illumination light beam from a radiation source to an object field. The illumination optical signal has at least one EUV mirror which has a reflective face with a nonplanar mirror topography for directing the illumination light beam. The disclosure also relates to an EUV attenuator for such an illumination optical system, an illumination system having an illumination optical system of this kind, and a projection exposure installation having an illumination system of this kind. Further, the disclosure relates to a method for producing a microstructured or nanostructured component and to a component produced using the method.

BACKGROUND

An attenuator for an illumination optical system in a projection exposure installation is known from US 2007/0041004 A1, from U.S. Pat. No. 6,445,510 B1 and from US 2007/0058274 A1.

SUMMARY

The disclosure provides an illumination optical system that allows for correction of unwanted variations in illumination parameters (e.g., an illumination intensity distribution, an illumination angle distribution) over the object field with few unwanted radiation losses.

In one aspect, the disclosure provides an illumination optical system for EUV microlithography for directing an illumination light beam from a radiation source to an object field,
  having at least one EUV mirror which has a reflective face with a nonplanar mirror topography for the purpose of forming the illumination light beam,
  having at least one EUV attenuator which is arranged in front of the EUV mirror and whose attenuator face which faces the reflective face of the EUV mirror has an attenuator topography which is designed to complement the mirror topography such that at least sections of the attenuator face are arranged at a constant interval from the reflective face.

According to the disclosure, unwanted variations in illumination parameters are corrected using the EUV attenuator. The complementary shaping of the attenuator topography relative to the mirror topography ensures that the EUV attenuator can be brought very close to the EUV mirror. Even if the illumination light beam hits the EUV mirror at an angle of incidence which is much different than 0, the possibility of bringing the EUV attenuator very close to the EUV mirror ensures so that double passage losses on account of an offset between the impingement location of the returning and departing beams of illumination light on the EUV attenuator are prevented or minimized. The advantages of an EUV attenuator in the form of a separate subassembly from the EUV mirror are maintained. It is thus possible for the EUV attenuator to be finely adjusted relative to the EUV mirror. In addition, it is possible to replace a particular EUV attenuator with an EUV attenuator of different design in order to change influencing of illumination parameters. Despite the very short interval, it is possible to safely prevent the EUV mirror and the EUV attenuator from touching one another. The EUV attenuator can be used to influence both an illumination angle distribution and an intensity distribution for the illumination light over the object field. The action of the EUV attenuator is dependent on the position thereof in the illumination optical system. In a plane provided for this positioning of the EUV attenuator in front of the EUV mirror, it is possible to alter parameters both for a field function and for a pupil function of object field illumination according to the situation of this plane. In so far as the EUV attenuator is situated in a plane which coincides with a field plane or with a pupil plane of the illumination optical system, it is possible to specifically influence exclusively parameters of the field function or parameters of the pupil function. The nonplanar mirror topography means that the attenuator topography of complementary design in respect of the mirror topography is also unlevel, that is to say uneven. The unlevel mirror topography can be caused by a corresponding curvature in the reflective face of the mirror or else by virtue of the mirror being divided into individual mirror segments, for example into individual mirror facets.

Intervals between the EUV attenuator and the EUV mirror which are in the region of no more than 200 μm have been found to be particularly suited.

The EUV attenuator may have at least one EUV diaphragm with a prescribed diaphragm contour. This ensures a well-defined attenuation action from the EUV attenuator. At points at which no attenuation is required, the illumination light is allowed to pass through or by the EUV attenuator completely and unattenuated.

Alternatively or in addition, the EUV attenuator may have at least one gray filter, that is to say a component with a gray filter function. This allows precise shaping of the profile of an attenuating action from the EUV attenuator by virtue of appropriately precise shaping of the profile of EUV attenuation by the gray filter. This means that the intensity of the illumination light can be modulated in line with a correction function. It is possible to influence or modulate a degree of homogeneity of the illumination of the object field, that is to say a degree of uniformity, to modulate or influence a degree of ellipticity or else a degree of telecentricity for the object field illumination. It is also possible to modulate or influence an intensity ratio for object field illumination between the illumination intensities from illumination angles which are prescribed in a defined fashion, what is known as pole balance. Single instances or else all of these cited parameters can be modulated or influenced.

A reflective face of the EUV mirror may be in the form of a freeform surface. This allows an object field illumination to be matched to particular presets. If desired, it is possible for a rectangular object field to be illuminated, for example, by virtue of the EUV mirror being of freeform surface design.

The reflective face of the EUV mirror may be in the form of a facet face with a plurality of reflective individual facets, at least some particular individual facets being able to have an associated attenuator section of the EUV attenuator. An attenuator section of this kind may be associated with a plurality of individual facets. The facet mirrors of this design may be particularly a field facet mirror or a pupil facet mirror of an illumination geometry, which is known from FIG. 12 in US 2007/0058274 A1, for example. The facets of a facet mirror of this kind may be inclined or tilted individually, in particular. In this case, the individual facets may be tilted individually in relation to a principal plane of the EUV mirror by tilt angles which are greater than 0.5°, which are greater than 1°, which are greater than 2°, which are greater than 3° or which are greater than 5°. In addition, the facets may have curved, in particular concavely curved, reflective faces for forming beams. Such a design allows particular individual facets to be attenuated with the EUV attenuator specifically in order to influence the object field illumination parameters. An individual attenuator section and/or a combination including a plurality of such attenuator sections can be produced from a body formed monolithically, in particular. This may be a body formed by electroplating.

The attenuator sections can produce individual attenuations. By way of example, two types of attenuator sections each with different attenuations or else more than two types of attenuator sections, for example three, four, five or even more of such types, may be provided. This allows the object field illumination parameters to be influenced with a correspondingly large number of degrees of freedom.

The attenuator sections may be in the form of diaphragms with shading edges, associated with the individual facets. This allows the individual facets to be attenuated in individualized fashion and precisely.

The facet face may be split into a plurality of facet blocks. The facet blocks may in turn combine a plurality of individual facets. The facet blocks may have interposed distance sections on the facet face. The complementarily shaped attenuator face of the EUV attenuator may have reinforcing struts on attenuator face sections which are arranged adjacent to the distance sections on the facet face. This allows the EUV attenuator to be of self-supporting design without this resulting in a significant undesirable loss of useful radiation.

The complementarily shaped attenuator face of the EUV attenuator may be in the form of a layer formed, particularly by electroplating, from the reflective face of the EUV mirror. This ensures a precise complementary shape for the attenuator face relative to the reflective face of the EUV mirror. This in turn results in the possibility of arranging the two faces at a very short interval from one another.

The formed layer of the EUV attenuator may be produced from nickel. Besides precise formation, this also allows the EUV attenuator to be designed to have a small wall thickness, which further reduces undesirable losses of useful radiation particularly in double passage. A wall thickness for the EUV attenuator may be greater than or equal to 0.03 mm. The wall thickness may be in the range between 0.03 mm and 0.3 mm and particularly in the range between 0.05 mm and 0.3 mm.

The formed layer may contain a plurality of diaphragms. In particular, this allows individualized shading of regions of the EUV mirror, particularly of individual facets of an EUV mirror in the form of a facet mirror.

Besides attenuator sections the formed layer may also contain nonattenuating through-openings. In this case, the EUV mirror is attenuated only at appropriate points to influence the object field illumination parameters. A facet design of the EUV mirror may be provided not only with correction facets, the illumination of which is influenced by the attenuator sections of the EUV attenuator, but also with uninfluenced basic illumination facets which have associated nonattenuating through-openings in the EUV attenuator.

In so far as an attenuator section of the EUV attenuator has some associated individual facets, the attenuator section may have a plurality of attenuator fingers which are diaphragms. Each attenuator finger can then be formed in a manner individually tuned to the at least one individual facet with which the attenuator finger is associated. This increases the degrees of freedom for producing the EUV attenuator for the illumination optical system.

Individually shaped shading edges of the attenuator fingers result in appropriate individual correction options for the illumination.

An association in which each individual facet has precisely one or at most two associated attenuator fingers allows a compact and at the same time easy-to-handle design for the EUV attenuator.

The attenuator fingers may be borne by a common mounting support. This results in the possibility of preassembling an attenuator section, which is associated with a plurality of individual facets, together with the common mounting support as a module.

The mounting support may have supporting brackets which are arranged on both sides of a facet block having a plurality of individual facets, the attenuator fingers being arranged between the two supporting brackets associated with the facet block. This allows a mounting support for the attenuator fingers in which as little useful reflective face of the facet mirror as possible is lost through undesirable shading.

The holding points for the attenuator fingers on the supporting brackets can be arranged at a level depending on the shape of the individual facets to be spanned, particularly depending on the profile of the reflective faces of these individual facets. In this way, the design of the supporting brackets can finely prescribe the interval between the attenuator fingers and the reflective faces of the associated individual facets.

The advantages of an EUV attenuator for an inventive illumination optical system, of an illumination system with an inventive illumination optical system and of a projection exposure installation with an inventive illumination system correspond to those which have already been explained above with reference to the inventive illumination optical system.

The advantages of a production method having the following steps:
a reticle is provided,
a wafer having a coating which is photosensitive to the illumination light is provided,
at least one section of the reticle is projected onto the wafer using the inventive projection exposure installation,
the photosensitive layer exposed to the illumination light beam is developed on the wafer; and the advantages of a microstructured or nanostructured subassembly produced in line with the disclosure correspond to those which have been explained above with reference to the inventive illumination optical system.

BRIEF DESCRIPTION OF THE DRAWINGS

An exemplary embodiment of the disclosure is explained in more detail below with reference to the drawing, in which.

DETAILED DESCRIPTION

Figure 1:
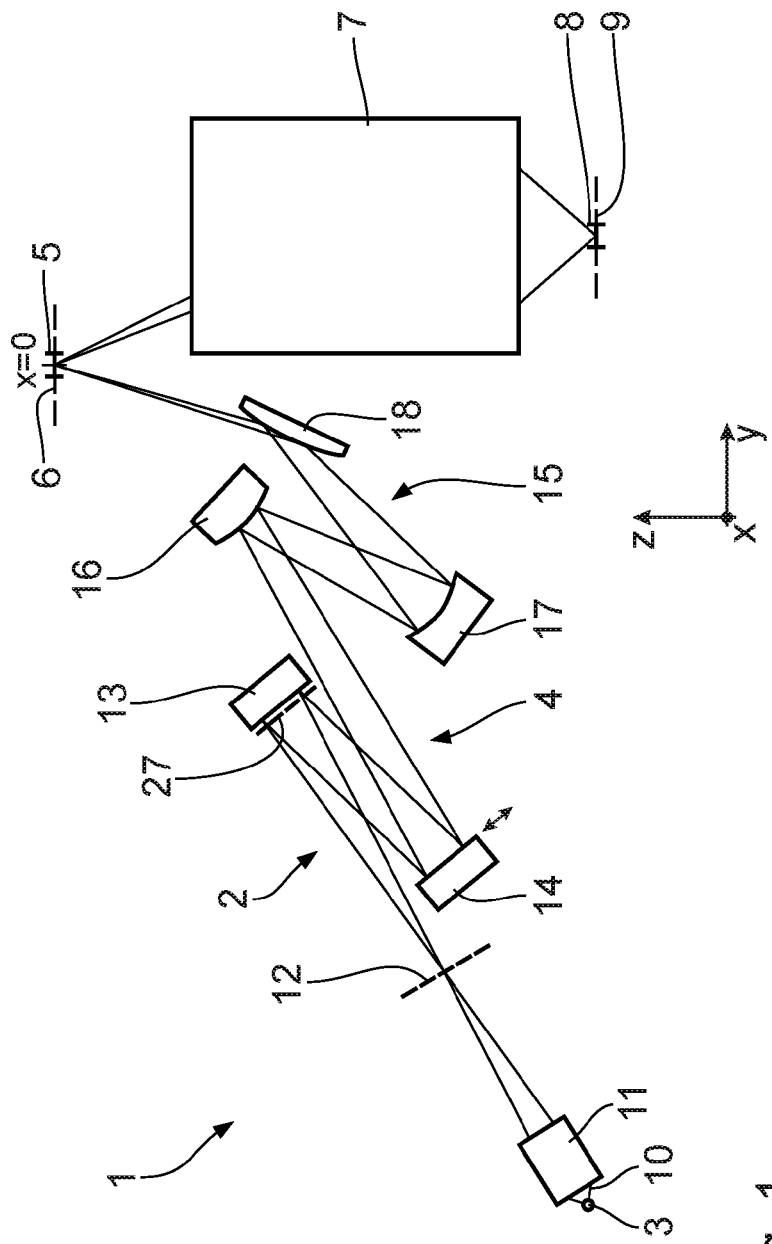
FIG. 1 schematically shows a meridional section through a projection exposure installation for microlithography with an illumination optical system and a projection optical system.

FIG. 1 schematically shows a meridional section through a projection exposure installation 1 for microlithography. An illumination system 2 in the projection exposure installation 1 has not only a radiation source 3 but also an illumination optical system 4 for exposing an object field 5 in an object plane 6. This involves the exposure of a reticle—not shown in FIG. 1—which is arranged in the object field 5 and which bears a structure to be projected with the projection exposure installation 1 for the purpose of producing microstructured or nanostructured semiconductor components.

A projection optical system 7 is used to map the object field 5 into an image field 8 in an image plane 9. The structure on the reticle is mapped onto a photosensitive layer of a wafer—not shown in the drawing—which is arranged in the region of the image field 8 in the image plane 9.

The radiation source 3 is an EUV radiation source with an emitted useful radiation in the range between 5 nm and 30 nm. It may be a plasma source, for example a GDPP (Gas Discharge Produced Plasma) source or an LPP (Laser Produced Plasma) source. Other EUV radiation sources, for example those based on a synchrotron, are also possible.

EUV radiation 10 coming from the radiation source 3 is concentrated by a collector 11. An appropriate collector is known from EP 1 225 481 A, for example. After the collector 11, the EUV radiation 10 propagates through an intermediate focus plane 12 before hitting a field facet mirror 13. The field facet mirror 13 is arranged in a plane of the illumination optical system 4 which is optically conjugate with respect to the object plane 6.

The EUV radiation 10 is subsequently also referred to as illumination light or as mapping light.

After the field facet mirror 13, the EUV radiation 10 is reflected by a pupil facet mirror 14. The pupil facet mirror 14 is arranged in a plane of the illumination optical system 4 which is optically conjugate with respect to a pupil plane of the projection optical system 7. The pupil facet mirror 14 and a mapping optical assembly in the form of a transmission optical system 15 with mirrors 16, 17 and 18, denoted in the order of the path of rays for the EUV radiation 10, are used to map field facets 19 (cf. FIG. 2) of the field facet mirror 13 into the object field 5 so as to be superimposed on one another. The last mirror 18 in the transmission optical system 15 is a grazing incidence mirror. The transmission optical system 15 is also referred to, together with the pupil facet mirror 14, as a sequential optical system for transmitting the EUV radiation 10 from the field facet mirror 13 to the object field 5.

To simplify the explanation of positional relationships, the text below uses a Cartesian xyz coordinate system. The x axis runs to the observer perpendicular to the plane of the drawing in FIG. 1. The y axis runs to the right in FIG. 1. The z axis runs upwards in FIG. 1.

The reticle, which is held by a reticle holder, not shown, and the wafer, which is held by a wafer holder, not shown, are scanned in sync in the y direction during operation of the projection exposure installation 1.

The object field 5 may be in arcuate or rectangular form. The aspect ratio from the x and y extents of the object field 5 corresponds to the aspect ratio of the field facets 19. In the exemplary embodiment shown, the field facets 19 are rectangular. The field facets 19 may also be arcuate in an embodiment which is not shown, with the ratio of the extents of such arcuate field facets in the x and y directions corresponding to the aspect ratio for the rectangular field facets 19 in the embodiment shown.

The x/y aspect ratio of the field facets 19 and of the object field 5 is 13/1, for example. Other aspect ratios greater than 1 are also possible. On the basis of these aspect ratios, the x axis is also referred to as the long field axis and the y axis is also referred to as the short field axis. A particular x coordinate within the object field 5 is also referred to as the field level.

The field facets 19 of the field facet mirror 13 are combined with a respective plurality of field facets 19 in field facet blocks 20. In the schematic illustration of the field facet mirror 13 shown in FIG. 2, each of the four field facet blocks 20 shown therein has eight field facets 19. In practice, there is a much larger number of such field facets blocks 20, as can be taken from the illustration of a further embodiment of the field facet mirror 13 shown in FIG. 4. In practice, the field facet mirror 13 has several hundred field facets 19. The field facet blocks 20 are arranged on a field facet support 21 which, in practice, can be adjusted in a plurality of degrees of freedom. A surface of the field facet support 21 which has the field facet blocks 20 arranged on it prescribes a principal plane for the field facet mirror 13. Particular instances of the field facets 19 or all of the field facets 19 are tilted individually by tilt angles of greater than 0.5°, for example, in relation to the principal plane of the field facet mirror 13. For particular instances of the field facets 19, the tilt angle may also be greater than 1°, greater than 2°, greater than 3° or else greater than 5°. Significantly larger tilt angles than 5° relative to the principal plane of the field facet mirror 13 are also possible. Depending on the design of the field facet mirror 13, the field facet blocks 20 may also be in adjustable form with respect to the field facet support 21.

The pupil facet mirror 14 (cf. FIG. 2) has a plurality of round pupil facets 22 which are arranged on a pupil facet support 23 in tightly packed hexagonal form, for example.

The field facets 19 and the pupil facets 22 may have a mapping action and be shaped in spherically concave form, for example.

The pupil facet support 23 can be designed to be adjustable in line with the field facet support 21. Alternatively or in addition to adjustability of the pupil facet support 23, the individual pupil facets 22 may also be of adjustable design in relation to the pupil facet support 23.

In practice, the highly reflective coating on the facets 19, 22 is a multilayer coating with alternating molybdenum and silicon layers. Other coating materials for producing a multilayer coating of this kind are also possible. The facets 19, 22 are mirror facets for the EUV radiation 10. For the purpose of adjusting individual field facet blocks 20 and/or individual pupil facets 22, these components may be individually connected to their associated actuators. These actuators may be in the form such that they allow the individual field facet blocks or the individual facets to be tilted about two axes situated in the reflection plane of the respective facet block or of the respective facet.

The field facets 19 are each individually associated with the pupil facets 22, so that components of the illumination light beam of the EUV radiation 10 which hit a respective one of the field facets 19 are forwarded to the object field 5 via the associated pupil facet 22. The two facet mirrors 13, 14 therefore define a plurality of illumination channels which route the EUV radiation 10 channel by channel to the object field 5. In total, the embodiment schematically shown in FIG. 2 has thirty two such illumination channels. The radiation source 3 is mapped on the pupil facets 22 in each of the illumination channels.

Figure 2:
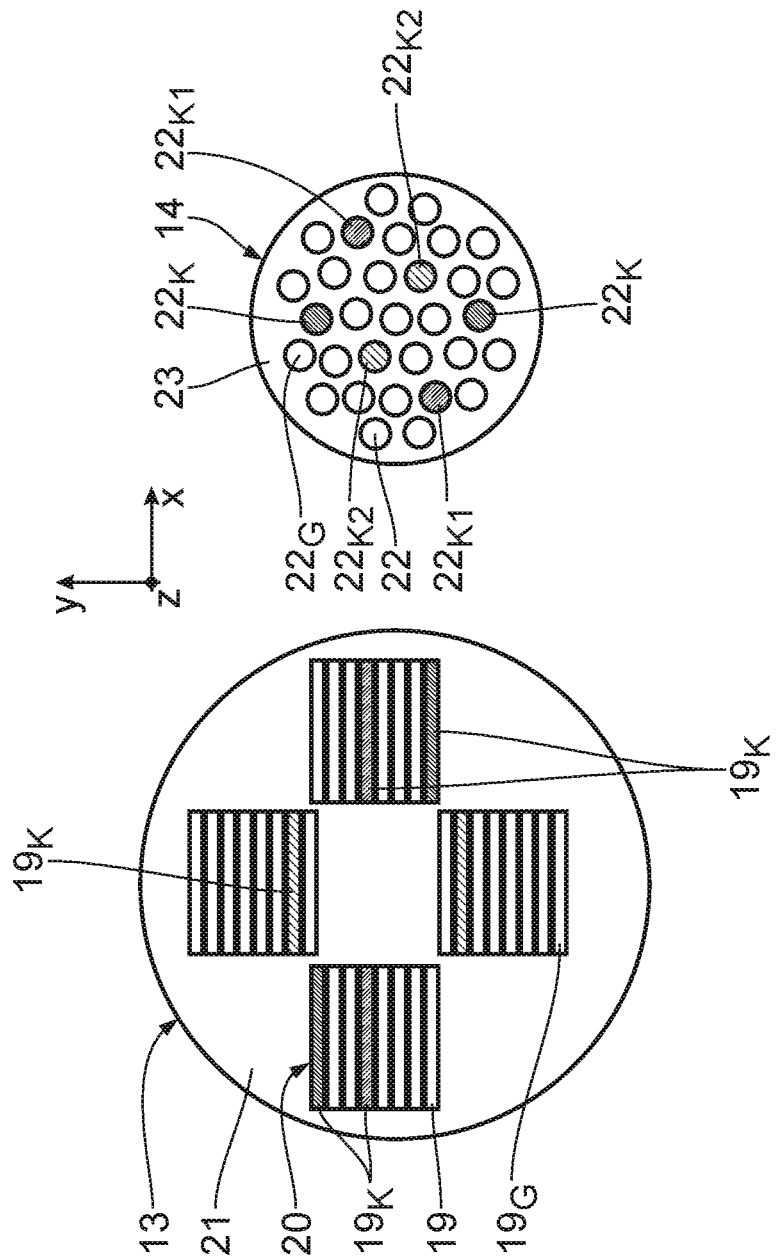
FIG. 2 schematically shows a respective plan view of a field facet mirror and a pupil facet mirror of the illumination optical system shown in FIG. 1, where particular field facets of the field facet mirror have associated individual attenuation sections of an EUV attenuator arranged in front of the field facet mirror.

The field facets 19 and the pupil facets 22 are divided into two respective facet types. FIG. 2 shows basic illumination field facets $19_G$ in plain form. FIG. 2 shows correction illumination field facets $19_K$ in shaded form. The basic illumination field facets $19_G$ have basic illumination pupil facets $22_G$ associated with them via illumination channels, said basic illumination pupil facets $22_G$ being shown as plain circles in FIG. 2.

The correction illumination field facets $19_K$ have correction illumination pupil facets $22_K$ associated with them via illumination channels, said correction illumination pupil facets $22_K$ being shown in shaded form in FIG. 2.

The basic illumination field facets $19_G$ provide basic illumination of the object field 5 via basic illumination channels using the associated basic illumination pupil facets $22_G$. The correction illumination field facets $19_K$ use the associated correction illumination pupil facets $22_K$ to provide correction illumination of the object field 5 via correction illumination channels.

The selection of which of the field facets 19 of the field facet mirror 13 are used as basic illumination field facets $19_G$ and which of the field facets 19 are used as correction illumination field facets $19_K$ is made according to the geometry and the intensity distribution of the illumination of the field facet mirror 13 with the illumination light beam of the EUV radiation 10 and according to the prescribed desired illumination of the object field 5. The correction illumination field facets $19_K$ used are those, by way of example, whose illumination has insufficient intensity for basic illumination or whose illumination has an intensity distribution which is unacceptable for basic illumination. The correction illumination field facets $19_K$ used may be bordering field facets 19, for example, or field facets 19 which to some extent, for example on account of shading phenomena, are not hit by the EUV radiation or are hit to an attenuated degree.

Figure 3:
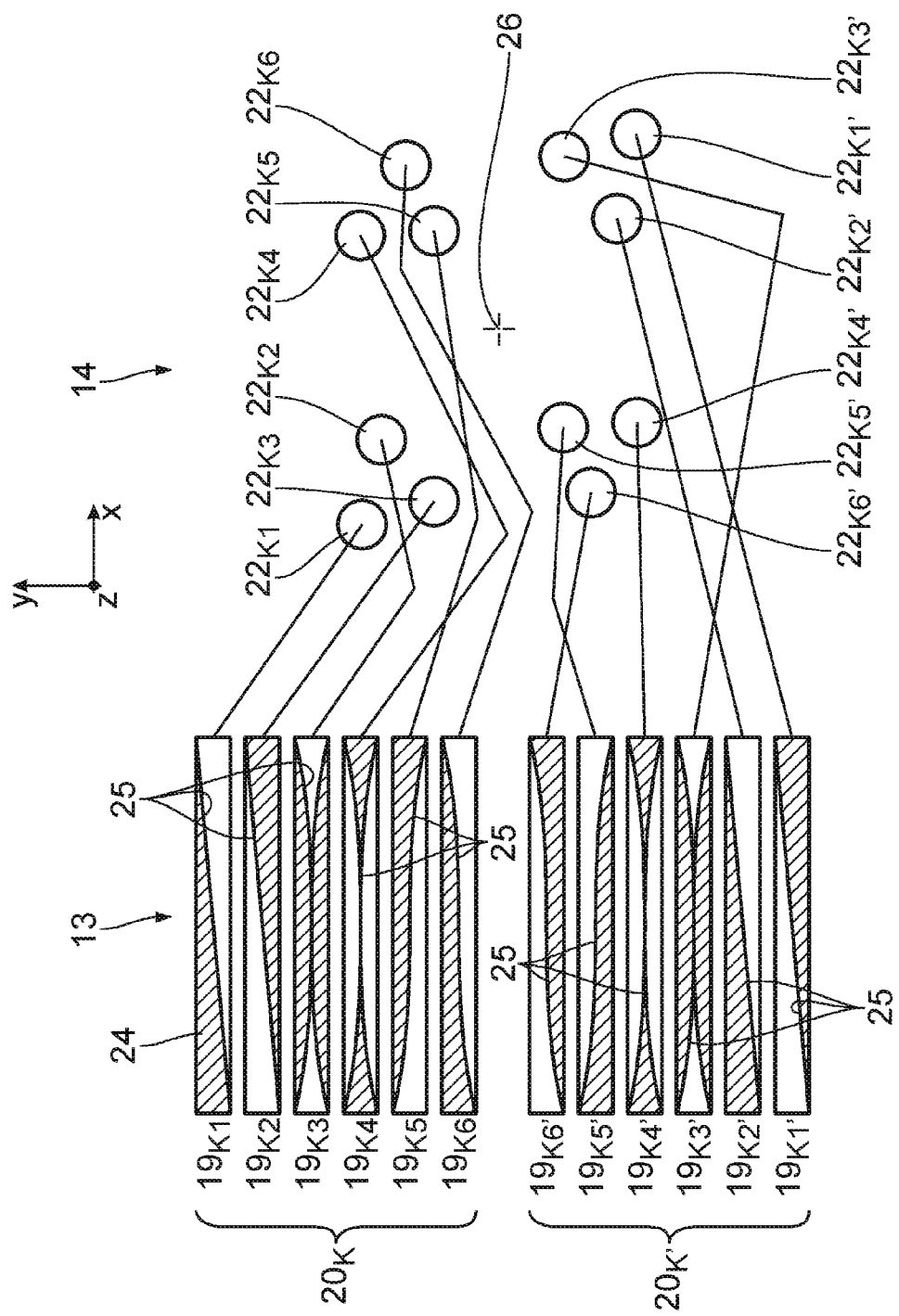
FIG. 3 shows a respective plan view of various types of attenuator sections, which are associated with individual facets of the field facet mirror, and pupil facets physically associated with these field facets.

The correction illumination field facets $19_K$ have associated EUV attenuators which are in the form of EUV diaphragms with a prescribed diaphragm contour. FIG. 3 shows examples of correction illumination field facets $19_{K1}$ to $19_{K6}$ and $19_{K1'}$ to $19_{K6'}$ with EUV diaphragms 24 of this kind, shown in shaded form, with diaphragm contours 25. The EUV diaphragms 24 are arranged at an interval from the reflective faces of the correction illumination facets $19_K$. This interval is at most 200 μm, but on the other hand is greater than 0, which means that the EUV diaphragms 24 do not touch the correction illumination facets $19_K$.

Each EUV diaphragm 24 is used as an attenuator section for the association correction illumination field facet $19_K$.

In this case, the correction illumination field facets $19_{K1}$ to $19_{K6}$ are combined in a correction illumination field facet block $20_K$. The correction illumination field facets $19_{K1'}$ to $19_{K6'}$ are combined in a correction illumination field facet block $20_{K'}$. These correction illumination field facets $19_{K1}$ to $19_{K6}$ and $19_{K1'}$ to $19_{K6'}$ are covered by the EUV diaphragms 24 in the sections shown in shaded form, so that the EUV radiation 10 impinging thereon is blocked. This blocking can be effected by absorption of the EUV radiation 10 or by reflection of the EUV radiation 10 from the path of rays and subsequent absorption. The shape of the diaphragm contours 25 of the EUV diaphragms 24 is different in each case for the correction illumination field facets $19_{K1}$ to $19_{K6}$. The correction illumination field facets $19_{K1}$ and $19_{K1'}$ have identically shaped diaphragms 24. This applies accordingly to the pairs $19_{K2}/19_{K2'}$ to $19_{K6}/19_{K6'}$ of the correction illumination field facets. The two field facet blocks $20_K$ and $20_{K'}$ are arranged in mirror-image symmetry with respect to one another relative to an x/z mirror-image symmetry plane.

On account of the different designs of the diaphragm contours 25 of the diaphragms 24 in the correction illumination field facets $19_{K1}$ to $19_{K6}$, the latter attenuate the EUV radiation 10 in the x direction with respective different profiles.

The diaphragm 24 of the correction illumination field facet $19_{K1}$ attenuates the EUV radiation 10 at the left-hand border in FIG. 3 completely. The attenuation decreases linearly towards the right-hand border, so that the EUV radiation 10 is reflected with the greatest possible efficiency at the right-hand border.

The correction illumination field facet $19_{K2}$ has an associated EUV diaphragm 24 with a diaphragm contour 25 which results precisely in an inverse attenuation profile, which thus does not result in any attenuation at the left-hand border in FIG. 3 and results in maximum attenuation of the EUV radiation 10 at the right-hand border.

The correction illumination field facet $19_{K3}$ has a diaphragm 24 with a diaphragm contour 25 having two crescent-shaped sections from the top and from the bottom in FIG. 3 which touch in the center of the correction illumination field facet $19_{K3}$. The correction illumination field facet $19_{K3}$ thus has, in the x direction, an attenuation profile which starts with minimum attenuation at the left-hand border in FIG. 3, moves to maximum attenuation at half x level and returns to minimum attenuation at the right-hand border.

The diaphragm 24 of the correction illumination field facet $19_{k4}$ has an inverse attenuation profile for the EUV radiation in the x direction in comparison with the correction illumination field facet $19_{K3}$. The correction illumination field facets $19_{K3}$ and $19_{k4}$ produce a parabolic attenuation profile in the x direction.

The diaphragm 24 of the correction illumination field facet $19_{K5}$ has an attenuation profile in the x direction which starts from minimum attenuation for the EUV radiation 10 at the left-hand border in FIG. 3 and returns to a maximum attenuation at the right-hand border. Between the two borders, the attenuation has a nonlinear dependency on the x coordinate. In this case, the attenuation follows a steady monotonous function. It is also possible to have other attenuation function profiles, particularly those with at least one minimum or at least one maximum and also unsteady profiles.

The diaphragm 24 of the correction illumination field facet $19_{K6}$ has an attenuation profile in the x direction which is the inverse of that of the correction illumination field facet $19_{K5}$.

The correction illumination field facet pairs $19_{K1}/19_{K1'}$ to $19_{K6}/19_{K6'}$ respectively form a group of standardized correction illumination field facets which, on account of the respective associated EUV diaphragms 24, have the same reflectivity profile over the long field dimension, that is to say along the x axis.

The pairs $19_{K1}/19_{K1'}$ to $19_{K6}/19_{K6'}$ of the correction illumination field facets have associated pairs of correction illumination pupil facet pairs $22_{K1}/22_{K1'}$ to $22_{K6}/22_{K6'}$ which are respectively arranged in point symmetry with respect to a center 26 of the pupil facet mirror 14.

This ensures that no change in a telecentricity of the object field illumination is brought about by the correction illumination channels.

Telecentricity is defined as follows for the illumination of the object field 5:

At every field point of the illuminated object field 5, a centroid ray is defined for a light bundle associated with this field point. In this case, the centroid ray has the energy-weighted direction of the light bundle coming from this field point. Ideally, at every field point the centroid ray runs parallel to the principal ray prescribed by the illumination optical system or the projection optical system 7.

The direction of the principal ray $\vec{s}_0(x,y)$ is known from the design data of the illumination optical system 4 or the projection optical system 7. The principal ray is defined at a field point by the connecting line between the field point and the center point of the entrance pupil of the projection optical system 7. The direction of the centroid ray at a field point x, y in the object field 5 in the object plane 6 is calculated as:

$$\vec{s}(x,y) = \frac{1}{\tilde{E}(x,y)} \int du\, dv \binom{u}{v} E(u, v, x, y).$$

E(u,v,x,y) is the power distribution for the field point x,y on the basis of the pupil coordinates u,v, that is to say on the basis of the illumination angle which the relevant field point x,y sees.

$\tilde{E}(x,y) = \int du\, dv\, E(u,v,x,y)$ is the total energy applied to the point x,y.

A central object field point $x_0$, $y_0$ sees the radiation, for example, from radiation subbeams from directions u,v, which is defined by the passage point of the respective radiation subbeams through the pupil planes of the illumination optical system 4. In the case of this illumination, the centroid ray s runs along the principal ray only if the various energies or intensities of the radiation subbeams are combined to form an integrated centroid ray direction which runs parallel to the principal ray direction. This is so only in the ideal case. In practice, there is a discrepancy between the centroid ray direction $\vec{s}(x,y)$ and the principal ray direction $\vec{s}_0(x,y)$ which is referred to as the telecentricity error $\vec{t}(x,y)$:

$$\vec{t}(x,y) = \vec{s}(x,y) - \vec{s}_0(x,y)$$

During practical operation of the projection exposure installation 1, it is desirable to correct not the static telecentricity error for a particular object field point but rather the telecentricity error scan-integrated at $x=x_0$. This results in:

$$\vec{T}(x_0) = \frac{\int dy\, \tilde{E}(x_0, y)\vec{t}(x_0, y)}{\int dy\, \tilde{E}(x_0, y)}.$$

The telecentricity error experienced in energy-weighted integrated form by a point (x, e.g. $x_0$) on the reticle that runs through the object field 5 in the object plane 6 during scanning is thus corrected. In this case, a distinction is drawn between an x telecentricity error (tx) and a y telecentricity error (ty). The x telecentricity error is defined as a discrepancy between the centroid ray and the principal ray perpendicular to the scan direction. The y telecentricity error is defined as the discrepancy between the centroid ray and the principal ray in the scan direction.

In a variant of correction illumination field facets which is not shown, there are groups of four respective correction illumination field facets $19_K$ with the same x profile of the EUV reflectivities in line with the groups of two $19_{K1}/19_{K1'}$ to $19_{K6}/19_{K6'}$ in the variant shown in FIG. 3. These groups of four of the correction illumination field facets have associated groups of four correction illumination pupil facets $22_K$ which are arranged evenly distributed over illumination channels around the center 26 of the pupil facet mirror 14, so that by diaphragms controlled connection of such a group of four correction illumination channels maintains an ellipticity $E_{0°/90°}$, for example. To be precise, the center 26 is the center of the pupil, prescribed by the pupil facet mirror 14, of the illumination optical system 4.

Ellipticity is a further measurement variable for assessing the quality of the illumination of the object field 5 in the object plane 6. In this case, determining the ellipticity allows a more accurate statement about the distribution of the energy or intensity over the entrance pupil of the projection optical system 7. To this end, the entrance pupil is divided into eight octants which are numbered anticlockwise from $O_1$ to $O_8$, as is mathematically usual. The energy or intensity contribution which the octants $O_1$ to $O_8$ of the entrance pupil make to the illumination of a field point is subsequently referred to as the energy or intensity contribution $I_1$ to $I_8$.

The following variable is referred to as $-45°/45°$ ellipticity (Elly, $E_{-45°/45°}$):

$$E_{-45°/45°} = \frac{I1 + I2 + I5 + I6}{I3 + I4 + I7 + I8}$$

and the following variable is referred to as $0°/90°$ ellipticity (Ellx, $E_{0°/90°}$):

$$E_{0°/90°} = \frac{I1 + I8 + I4 + I5}{I2 + I3 + I6 + I7}.$$

In accordance with what has been stated above with regard to the telecentricity error, it is also possible to determine the ellipticity for a particular object field point $x_{FP}$, $y_{FP}$ or else for scan-integrated illumination ($x=X_{FP}$, y-integrated).

A functional profile for the diaphragm contours 25 of the EUV diaphragms 24, which are associated with the correction illumination field facets $19_K$, on the basis of the x dimension may be linear in x, as in the case of the correction illumination field facets $19_{K1}$, $19_{K1'}$, or may be quadratically dependent on x, as in the case of the correction illumination field facets $19_{K2}$ to $19_{K2'}$, for example. A different polynomial dependency on x, for example with higher powers of x, is also possible. A sine or cosine dependency on x for producing a Fourier decomposition of a reflectivity dependency of the correction illumination field facets $19_K$ on the x dimension, for example, is also possible. Generally, the various correction illumination field facets, for example the correction illumination field facets $19_{K1}$ to $19_{K6}$, can be used to produce a set of reflectivity dependencies on x which corresponds to a set of orthogonal functions. This allows virtually any illumination corrections to be made for illumination parameters of the object field 5, particularly the illumination parameters telecentricity and ellipticity.

FIGS. 4 to 8 are subsequently used to explain the manufacture of the EUV attenuator 27 (cf. FIG. 8) with a plurality of the EUV diaphragms 24.

Figure 4:
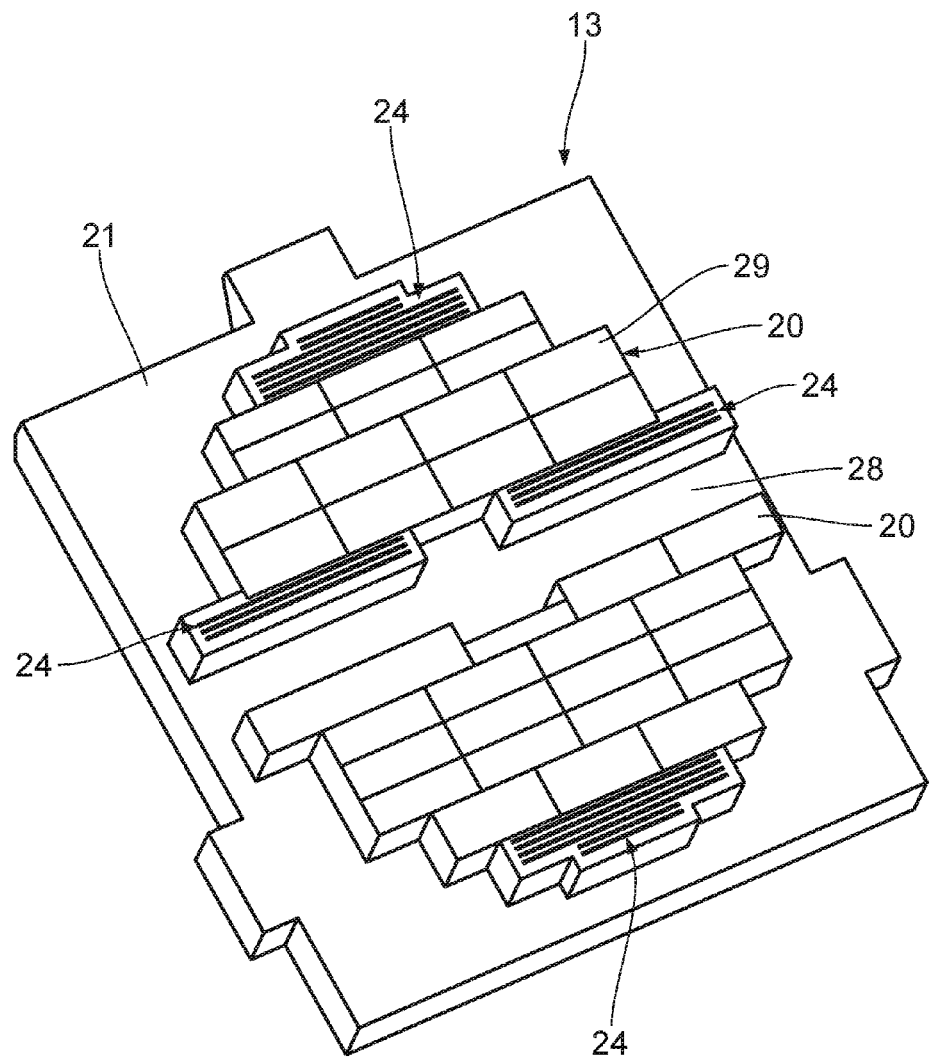
FIG. 4 shows a perspective view of a further embodiment of a field facet mirror whose facet face is split into a plurality of facet blocks in which a plurality of individual facets are in turn combined.

FIG. 4 first of all shows an embodiment of a field facet mirror 13 with a practical arrangement of field facets 19 combined to form field facet blocks 20 on the field facet support 21. A basic body of the field facet blocks 20 includes aluminum. Two respective roughly semicircular arrangements of the field facet blocks 20 have an interspace 28 between them which, when the field facet mirror 13 is illuminated, is shaded and is therefore not illuminated by the EUV radiation 10.

Figure 5:
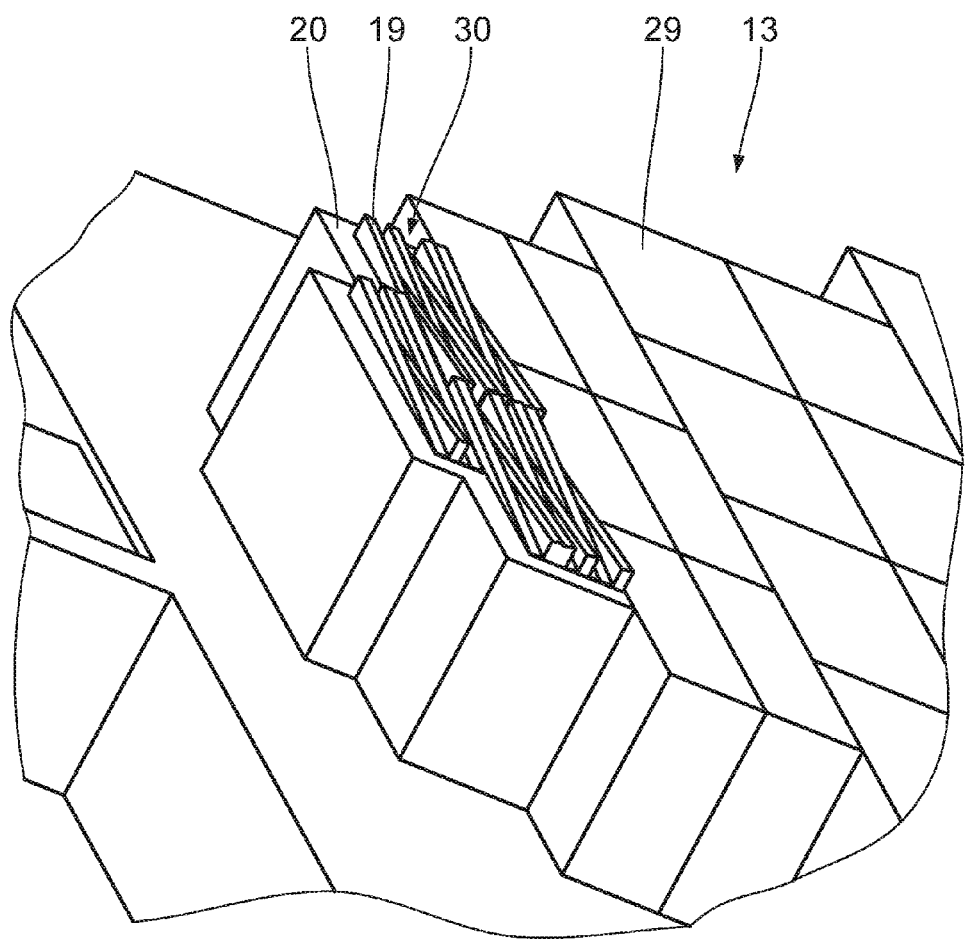
FIG. 5 shows an enlarged view of a detail from the field facet mirror in FIG. 4, wherein facet blocks which are shown less schematically than the other facet blocks bear an electroplated forming layer for the purpose of producing an EUV attenuator.

FIG. 5 shows an enlarged detail from a group of three field facet blocks 20 which is shown at the top left in FIG. 4. FIG. 5 reveals that the individual field facets 19 of a field facet block 20 are tilted with respect to one another, in this way divert the EUV radiation 10 differently channel by channel and therefore illuminate pupil facets 22 of the pupil facet mirror 14 which are arranged physically separate from one another. In addition, the concavely spherical design of the individual field facets 19 can be seen. This design of the field facets 19 results in the field facet mirror 13 being an EUV mirror which, to form the EUV radiation 10 impinging as an illumination light beam, has a reflective face 29 with a nonplanar mirror topography. This topography is shown realistically in the drawing only in the region of the three facet blocks 20 highlighted in FIG. 5, and is otherwise shown schematically as a planar face.

The three field facet blocks 20 highlighted in FIG. 5 by the detail illustration of the field facets 19 have an attenuator blank 30 integrally formed on them as an electroplated nickel coating. The integral formation of the attenuator blank 30 takes place before the basic body of the field facet blocks 20 is provided with the EUV reflective coating.

On the basis of the electroplating formation, that attenuator face 31 of the attenuator blank 30 which faces the reflective face 29 takes on the topography of the reflective face 29. Following the electroplating formation, the attenuator face 31 of the attenuator blank 30 thus has an attenuator topography which is of complementary design to the mirror topography of the reflective face 29.

Figure 6:
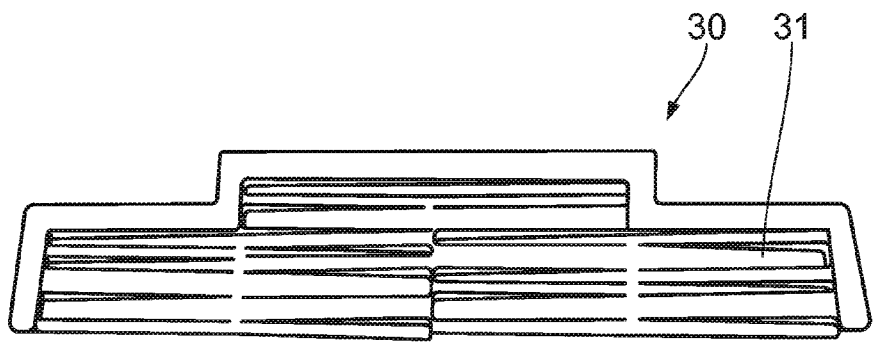
FIGS. 6 and 7 show two perspective views of a blank, produced by electroplating, for an EUV attenuator for a facet block of the field facet mirror shown in FIG. 4.
Figure 7:
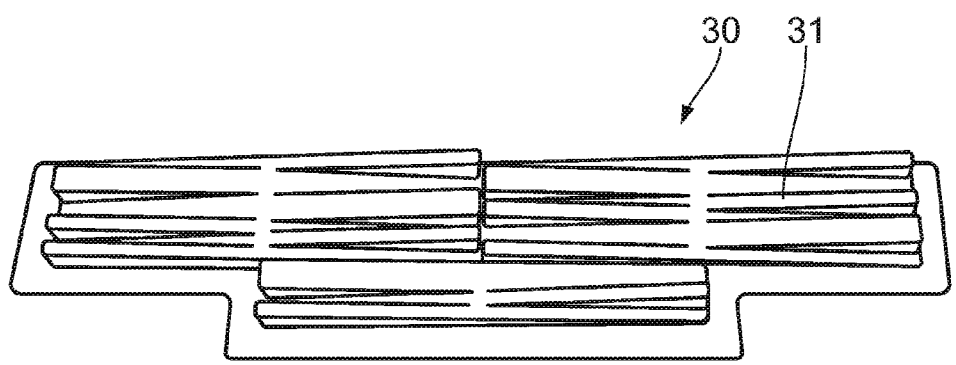

FIG. 6 shows the attenuator blank 30 after formation from the reflective face 29 and after subsequent separation therefrom. The attenuator face 31 which faces the reflective face 29 during formation and also in a later operational position of an EUV attenuator 27 produced from the attenuator blank 30 faces the observer. FIG. 7 shows the attenuator blank 30 as seen from the side opposite the attenuator face 31.

FIG. 6 shows that the attenuator face 31 has adopted the contour of the tilted and concavely designed field facets 19 with a high level of precision.

In a step which follows the electroplating formation, the EUV diaphragms 24 associated with the correction illumination field facets $19_K$ are now produced with the respective associated diaphragm contours 25. This can be done using a laser material removal method or by wire eroding, for example.

Figure 8:
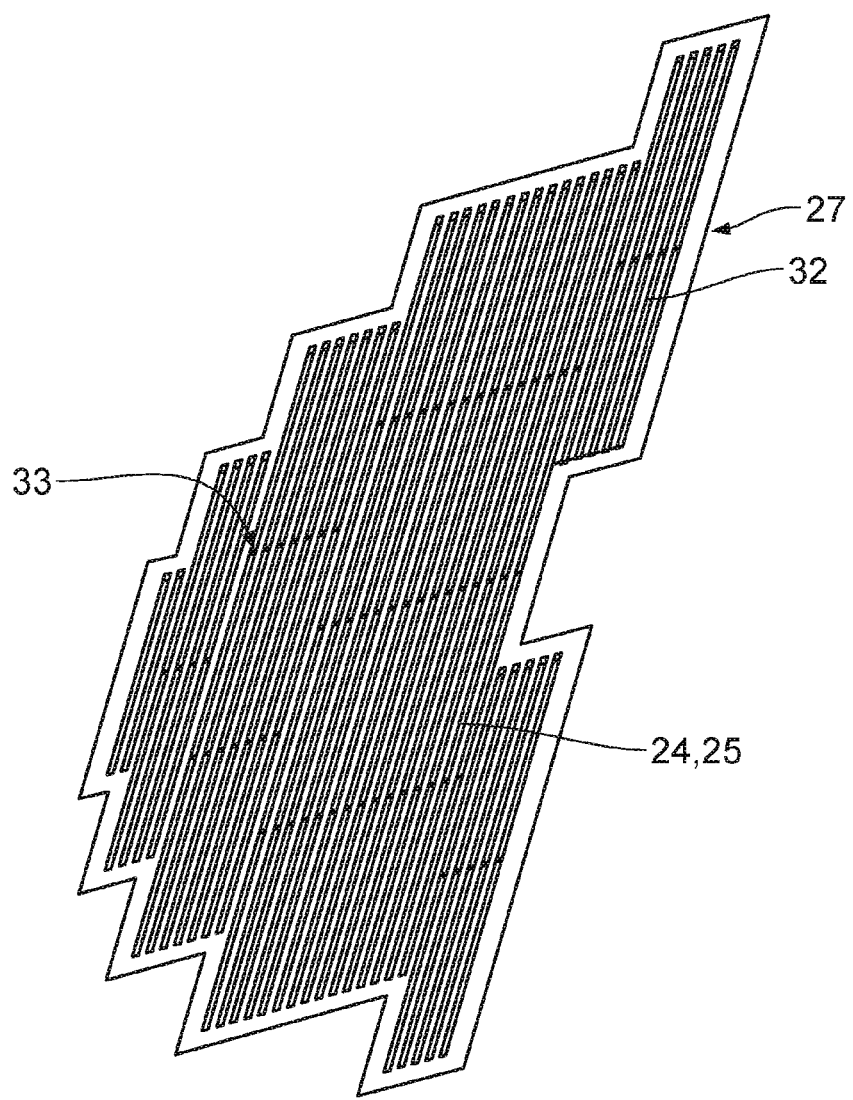
FIG. 8 shows a perspective schematic view of an EUV attenuator produced from a blank formed by electroplating, wherein each of the individual facet mirrors of the field facet mirror shown in FIG. 4 has an associated EUV diaphragm with a prescribed diaphragm contour or a through-opening which does not attenuate EUV light.

The result is a section of the EUV attenuator 27 shown in FIG. 8. FIG. 1 schematically indicates the arrangement of the EUV attenuator 27 in front of the field facet mirror 13. In the case of the EUV attenuator 27, a blank which has been produced by forming an entire half of the field facet mirror 13 by electroplating has been assumed. The diaphragm contours 25 of the EUV diaphragms 24 of the EUV attenuator 27 are shown schematically as rectangular openings in FIG. 8. In practice, the diaphragm contours 25 for the correction illumination field facets $19_K$ have shapes as shown in FIG. 3, for example. The individual EUV diaphragms 24 may be held by a frame 31a. In this case, individual frame elements may be provided for groups of EUV diaphragms 24 which are associated with individual facet groups of the field facet mirror 13, said individual frame elements holding these groups of EUV diaphragms 24. The diaphragm 31a or the individual frame elements may have holding structures for mounting the EUV attenuator 27 on a supporting body of the field facet mirror 13.

The basic illumination field facets $19_G$ have associated through-openings 32 extending over the entire reflective face of these basic illumination field facets $19_G$. In the schematic illustration shown in FIG. 8, the through-openings 32 do not differ in shape from the diaphragm contours 25 of the EUV diaphragms 24.

Adjacent EUV diaphragms 24 and through-openings 32 of the EUV attenuator 27 have reinforcements 33 between them which ensure self-supporting stability for the lattice-like EUV attenuator 27.

Figure 9:
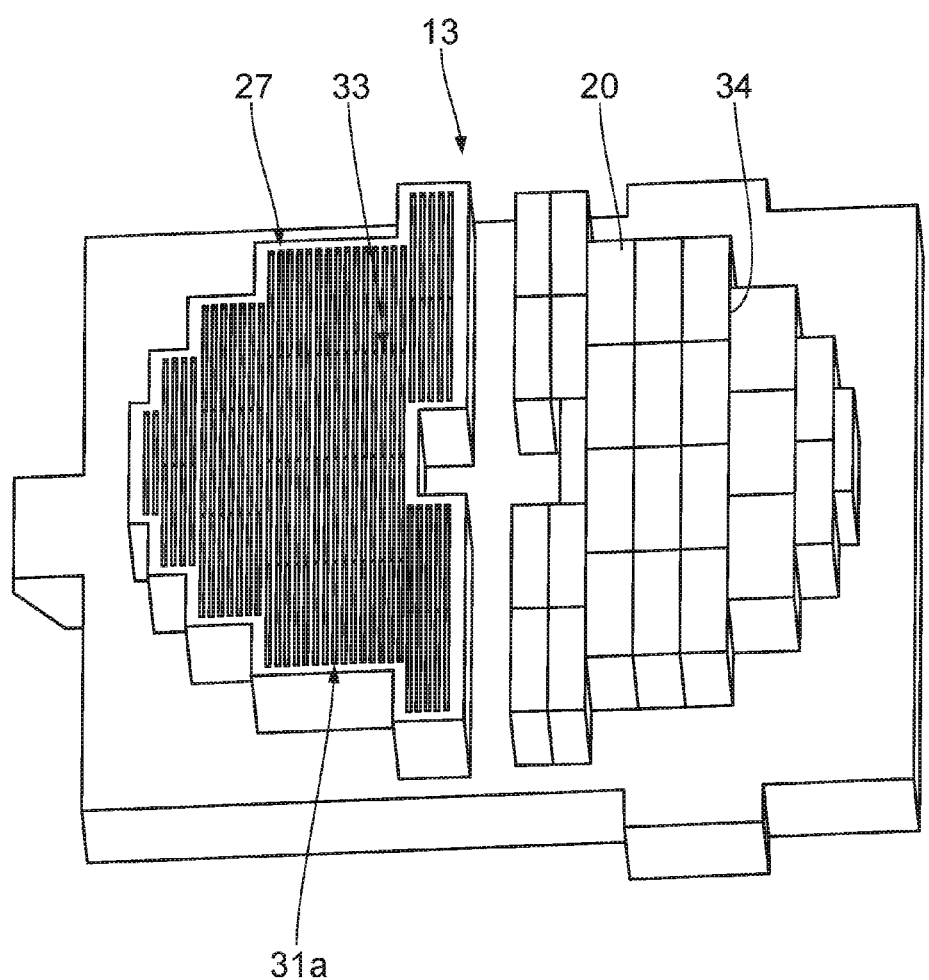
FIG. 9 shows the field facet mirror shown in FIG. 4 with the EUV attenuator shown in FIG. 8 mounted on its left half.

FIG. 9 shows the field facet mirror 13 with the EUV attenuator 27 shown in FIG. 8, which is arranged adjacent to the reflective face 29 of the left-hand half of the field facet mirror 13 in FIG. 9. Since the EUV attenuator 27 has been produced by forming precisely this left-hand half of the field facet mirror 13 by electroplating, it can be brought extremely close to the field facets 19 of the field facet mirror 13 without touching them. In practice, an interval of approximately 100 μm can be produced between the reflective face 29 and the attenuator face 31. The interval between the reflective face 29 and the attenuator face 31 is no more than 200 μm.

This short interval between the EUV attenuator 27 and the field facet mirror 13 means that undesirable double-passage losses at the borders of the diaphragm contours 25 or the through-openings 32 are prevented or reduced to a minimum on account of the angle of incidence of the EUV radiation 10 on the field facets 19 of the field facet mirror 13 being different than zero.

FIG. 9 reveals that the reinforcements 33 are in the form of reinforcing struts which are adjacent to interspaces between the individual facets 19 and distance sections 34 between the facet blocks 20 and run parallel thereto. The reinforcements or reinforcing struts 33 therefore effectively do not result in a loss of useable EUV radiation 10.

As an alternative to the refinement of the EUV attenuator 27 with EUV diaphragms 24 with individual diaphragm contours 25, it is possible to attain individual attenuation of the correction illumination field facets $19_K$ also via an individual gray filter design at the location of the EUV diaphragms 24 of the above-described exemplary embodiment of the EUV attenuator 27. A gray filter used at the location of the EUV diaphragms 24 may be an absorber layer of variable thickness, for example. Alternatively or in addition, a prescribed distribution of absorbing point structures may be provided on gray filter sections, the attenuation profile of which in the x direction, that is to say in the direction of the long field axis, corresponds to that of the EUV diaphragms 24 described above.

FIGS. 10 to 13 are subsequently used to explain a further variant of an EUV attenuator 35 which can be used instead of the EUV attenuator 27 or in addition thereto. Components and functions which correspond to those which have already been explained above with reference to FIGS. 1 to 9 have the same reference numerals and are not discussed in detail again.

Figure 10:
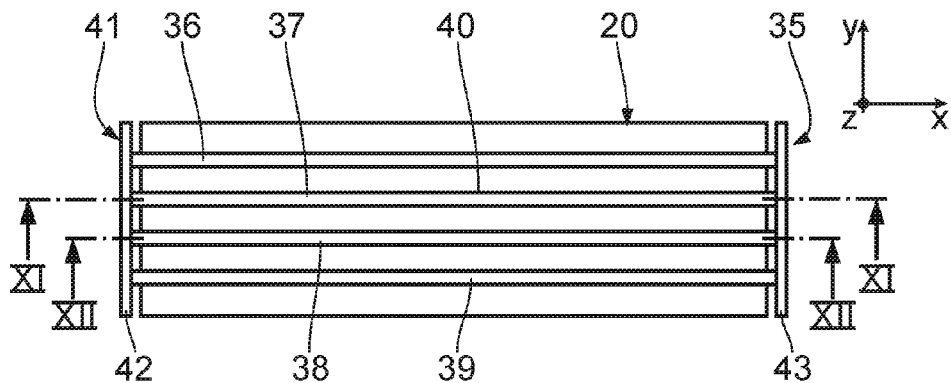
FIG. 10 shows a plan view of a facet block of the field facet mirror shown in FIG. 4 with a further embodiment of an EUV attenuator.

FIG. 10 shows one of the field facet blocks 20 of the field facet mirror 13 shown in FIG. 4. This field facet block 20 has the EUV attenuator 35 associated with it, which is used as an attenuator section for the correction illumination field facets $19_K$ of the field facet block 20.

The EUV attenuator 35 has a plurality of attenuator fingers. FIG. 10 shows a total of four attenuator fingers 36, 37, 38 and 39, numbered from top to bottom in increasing order in FIG. 10. Each of the attenuator fingers 36 to 39 is a diaphragm for its associated correction illumination field facet $19_K$. The attenuator fingers 36 to 39 run at a constant interval A from the reflective faces 29 of their associated correction illumination field facets $19_K$. The interval A between the attenuator fingers 36 to 38 and the reflective faces 29 of the associated correction illumination field facets $19_K$ is also no more than 200 μm in the embodiment shown in FIGS. 10 to 13.

The correction illumination field facets $19_K$ of the field facet block 20 have a respective individual tilt angle for their reflective face 29 with respect to the x-y plane, that is to say with respect to the principal plane of the field facet mirror 13. The correction illumination field facet $19_K$, which is associated with the attenuator finger 37, runs obliquely from the top left to the bottom right in FIG. 11. The correction illumination field facet $19_K$, which is associated with the attenuator finger 38, runs obliquely from the bottom left to the top right in FIG. 12. On the basis of this tilt angle, a respective associated pupil facet 22 of the pupil facet mirror 14 is illuminated, having been reflected by the respective correction illumination field facet $19_K$.

The attenuator fingers 36 to 39 may be in the form of wire-like metal fingers. Shading edges 40, which are shown running in a straight line in the x direction in the plan view of FIG. 10, may be individually fashioned or shaped in the x-y plane so as to attain a correction illumination, as already explained above in connection with FIGS. 1 to 9. The shading edges may be fashioned by laser material machining, by wire eroding or photo-etching.

Each of the correction illumination facets $19_K$ may have precisely one of the attenuator fingers 36 to 39 associated with it which shades a central section of the reflective face 29 of the associated correction illumination field facets $19_K$ as seen in the y dimension, for example. A plurality of the attenuator fingers 36 to 39 may also be associated with precisely one of the correction illumination field facets $19_K$ of the field facet block 20. It is also possible for two of the attenuator fingers 36 to 39 to be associated with precisely one of the correction illumination field facets $19_K$.

The attenuator fingers 36 to 38 are borne by a common mounting support 41. This has two supporting brackets 42, 43. The two supporting brackets 42, 43 are arranged on both sides of the facet block 20. The attenuator fingers 36 to 39 run between the two supporting brackets 42, 43.

Figure 11:
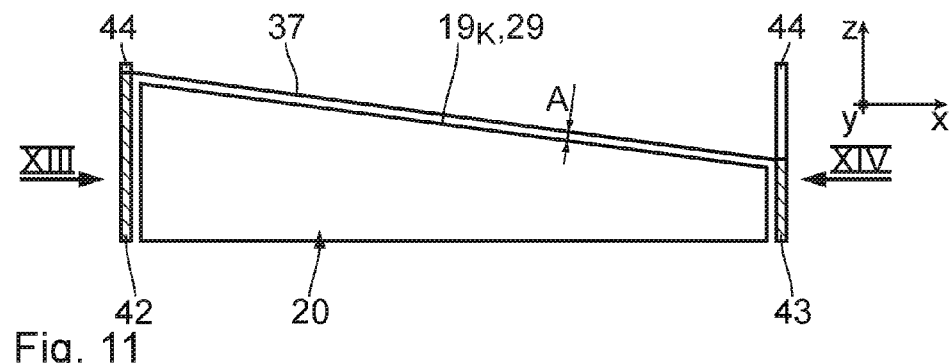
FIG. 11 shows a section along the line XI-XI in FIG. 10.
Figure 12:
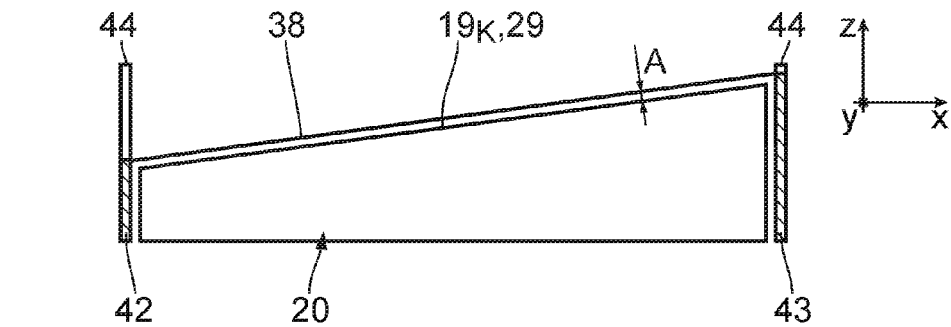
FIG. 12 shows a section along the line XII-XII in FIG. 10.
Figure 13:
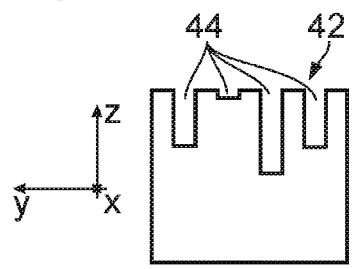
FIG. 13 shows a view of a supporting bracket for the EUV attenuator shown in FIG. 10, seen from the viewing direction XIII in FIG. 11.
Figure 14:
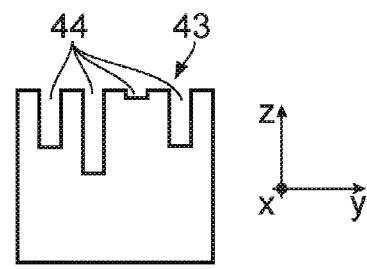
FIG. 14 shows a view of a supporting bracket for the EUV attenuator shown in FIG. 10, seen from a viewing direction XIV in FIG. 11.

Holding points for the attenuator fingers 36 to 39 on the supporting brackets 42, 43 are formed by supporting grooves 44 in the supporting brackets 42, 43. According to the tilted profile of the reflective face 29 of the correction illumination field facets $19_K$, the depth of the supporting grooves 44 is designed for the associated attenuator fingers 36 to 39. The ends of the attenuator fingers 36 to 39 are respectively supported on the base of the associated supporting groove 44. The attenuator fingers 36 to 39 may be bonded, for example, to the base of the associated supporting grooves 44. For the attenuator finger 37, the supporting groove 44 in the supporting bracket 42 shown on the left in FIGS. 11 and 12 is only of small depth, whereas the supporting groove 44 in the supporting bracket 43 shown on the right in FIGS. 11 and 12 has a very large depth. For the attenuator finger 38, the supporting groove 44 in the supporting bracket 42 is of large depth, and the supporting groove 44 in the supporting bracket 43 is only of small depth. For the two bordering attenuator fingers 36, 39, supporting grooves 44 of average depth are provided, so that the attenuator fingers 36, 39 run parallel to the x direction, like the reflective faces 29 of the associated correction illumination field facets $19_K$. The supporting grooves 44, that is to say the holding points for the attenuator fingers 36 to 39 on the supporting brackets 42, 43, are thus arranged at a level depending on the shape of the correction illumination individual facets $19_K$ which are to be spanned.

The supporting brackets 42, 43 are inserted between the field facet block 20 shown in FIG. 10 and the field facet blocks (not shown) which follow it adjacently in the x direction.

Illumination correction is carried out as follows using the illumination optical system 4: first, an appropriate detector is used to ascertain an intensity distribution for the illumination of the object field 5. In addition, it is also possible to measure an angle distribution for the illumination of the object field 5. This measurement result is used to calculate the design of the correction illumination field facets $19_K$. Next, the calculated design and association are provided in the illumination optical system 4, which can be done by specifically selecting correction illumination field facets $19_K$ which are used, for example. Subsequently, the projection exposure then takes place, which involves the reticle and the wafer, which carries a coating which is photosensitive to the illumination light 10, being provided and then at least one section of the reticle being projected onto the wafer using the projection exposure installation 1. Finally, the photosensitive layer exposed to the illumination light beam 10 is developed on the wafer.

The different variants of the correction illumination field facets explained above can be used to dynamically control the beam guidance action thereof. To this end, the correction illumination field facets can be actuated by a control device in the projection exposure installation. This actuation can take place on the basis of measurements of the intensity profile over the long field dimension in the object field or else in the image field.

When the field facet mirror 13 is operated with the correction illumination field facets, individual correction illumination field facets or groups of correction illumination field facets can be connected or disconnected, particularly if they are in actively relocatable or actively shadable form.

Different embodiments of the correction illumination field facets as described above allow only subregions of the object field to be illuminated. This can be used to equalize intensity dips at particular field levels as a result of mixing in illumination light provided via correction illumination field facets at these field levels, that is to say in subregions of the field.

The edge shapes of effectively illuminated regions of the different embodiments of correction illumination field facets as explained above may have at least one turning point. This edge may be the dividing line between a highly reflective and less efficiently reflective or nonreflective region of the correction illumination field facet. The edge with at least one turning point may also be a physically present facet edge. The edge can also be produced by an appropriately shaped shading body.

Figure 15:
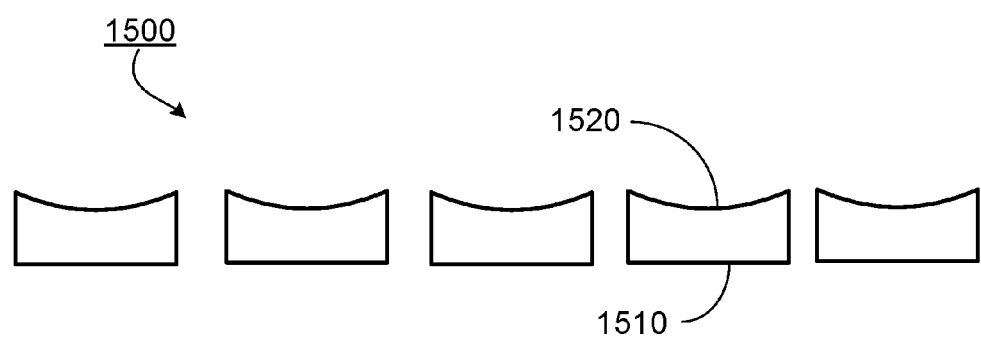
FIG. 15 shows a side view of an EUV mirror having curved facet faces.

FIG. 15 shows a side view of an EUV mirror 1500 having facets 1510 with curved facet faces 1520.

What is claimed is:

1. An illumination optical system configured to direct an illumination light beam to an object field along an illumination light path, the illumination optical system comprising:
   an EUV mirror having a reflective surface with a nonplanar topography, the reflective surface of the EUV mirror being in the illumination light path; and
   an EUV attenuator arranged upstream of the EUV mirror along the illumination path, the EUV attenuator having a surface which faces the reflective surface of the EUV mirror,
   wherein:
      the reflective surface of the EUV mirror is a facet surface comprising a plurality of individual reflective facets, the facets comprise concavely curved reflective faces;
      each of at least some of the individual reflective facets has an associated attenuator section of the EUV attenuator;
      each attenuator section has an edge that is spaced at a constant interval from the reflective surface of its associated facet;
      the facet surface is divided into a plurality of facet blocks;
      each facet block comprises a plurality of individual facets;
      the facet blocks have interposed distance sections on the facet surface;
      the surface of the EUV attenuator comprises reinforcing struts adjacent the distance sections; and
      the illumination optical system is an EUV microlithography illumination optical system.

2. The illumination optical system of claim 1, wherein for each attenuator section:
   the attenuator section has a portion that is spaced at a constant interval from the reflective surface of its associated facet;
   the portion of the attenuator section comprises the edge of the attenuator section; and
   the portion of the attenuator section defines an area which extends inside the edge of the attenuator section.

3. The illumination optical system of claim 2, wherein the constant interval is at most 200 μm.

4. The illumination optical system of claim 1, wherein the attenuator sections comprise plurality of EUV diaphragms.

5. The illumination optical system of claim 1, wherein the EUV attenuator comprises an EUV gray filter.

6. The illumination optical system of claim 1, wherein the reflective surface of the EUV mirror is a freeform surface.

7. The illumination optical system of claim 1, wherein the attenuator sections are configured to produce individual attenuations.

8. The illumination optical system of claim 1, wherein each attenuator section comprises a plurality of attenuator fingers which are diaphragms.

9. The illumination optical system of claim 8, wherein the attenuator fingers have individually shaped shading edges.

10. The illumination optical system of claim 8, wherein each individual facet has at most two associated attenuator fingers.

11. The illumination optical system of claim 8, wherein the attenuator fingers are carried by a common mounting support.

12. The illumination optical system of claim 11, wherein the common mounting support has supporting brackets arranged on both sides of a facet block which has a plurality of individual facets, and wherein the attenuator fingers are between the two supporting brackets associated with the facet block.

13. The illumination optical system of claim 12, wherein holding points for the attenuator fingers on the supporting brackets are arranged at a level depending on the shape of the individual facets to be spanned.

14. An illumination system, comprising:
   an EUV radiation source; and
   an illumination optical system according to claim 1.

15. A projection exposure installation, comprising:
   an EUV radiation source;
   an illumination optical system according to claim 1; and
   a projection optical system configured to project the object field into an image field.

16. A method, comprising:
   providing a projection exposure installation, comprising:
      an illumination system comprising an illumination optical system according to claim 1;
      a projection optical system configured to project the object field into an image field; and
      a wafer having a coating which is photosensitive to the illumination light; and
   using the projection objective to project at least a portion of a reticle onto a photosensitive coating of a wafer to provide an exposed photosensitive coating.

17. The method of claim 16, further comprising developing the exposed photosensitive layer.

18. The illumination optical system of claim 1, wherein for each attenuator section:
- the attenuator section has a portion that is spaced at a constant interval from the reflective surface of its associated facet; and
- the portion of the attenuator section does not comprise the edge of the attenuator section.

19. The illumination optical system of claim 1, wherein, for each attenuator section, an entire surface of the attenuator section facing the reflective surface of its associated facet is spaced at a constant interval from the reflective surface of its associated facet.

20. The illumination optical system of claim 1, wherein, for each attenuator section, the attenuator section comprises a portion which is planar.

21. The illumination optical system of claim 1, wherein an edge of a first attenuator section is not parallel to an edge of a second attenuator section.

22. An illumination optical system configured to direct an illumination light beam to an object field along an illumination light path, the illumination optical system comprising:
- an EUV mirror having a reflective surface with a nonplanar topography, the reflective surface of the EUV mirror being in the illumination light path; and
- an EUV attenuator arranged upstream of the EUV mirror along the illumination path, the EUV attenuator having a surface which faces the reflective surface of the EUV mirror, wherein:
- the EUV attenuator is formed by a process comprising:
  - integrally forming an attenuator blank on a basic body of the EUV mirror before the reflective surface of the EUV mirror is formed; and
  - removing the attenuator blank from the basic body of the EUV mirror; and
- the surface of the EUV attenuator has a topography configured so that at least sections of the surface of the EUV attenuator are arranged at a constant interval from the reflective surface of the EUV mirror without contacting the reflective surface of the EUV mirror; and
- the illumination optical system is an EUV microlithography illumination optical system.

23. The illumination optical system of claim 22, wherein integrally forming an attenuator blank on a basic body of the EUV mirror before the reflective surface of the EUV mirror is formed comprises electroplating the attenuator blank on the basic body of the EUV mirror.

24. An illumination optical system configured to direct an illumination light beam to an object field along an illumination light path, the illumination optical system comprising:
- an EUV mirror having a reflective surface with a nonplanar topography, the reflective surface of the EUV mirror being in the illumination light path; and
- an EUV attenuator arranged upstream of the EUV mirror along the illumination path, the EUV attenuator having a surface which faces the reflective surface of the EUV mirror, wherein:
- the reflective surface of the EUV mirror is a facet surface comprising a first reflective facet, and a second reflective facet, the first reflective facet inclined individually at a first inclination, and a second reflective facet inclined individually at a second inclination, the first inclination being different from the second inclination;
- the first reflective facet and/or the second reflective facet has an associated attenuator section of the EUV attenuator;
- each attenuator section has an edge that is spaced at a constant interval from the reflective surface of its associated facet; and
- the illumination optical system is an EUV microlithography illumination optical system.

* * * * *